US012684811B2

(12) United States Patent
Zhang et al.

(10) Patent No.: US 12,684,811 B2
(45) Date of Patent: Jul. 14, 2026

(54) SEMICONDUCTOR DEVICE INCLUDING TRENCH GATE AND SOURCE OPEN END AND MANUFACTURING METHOD THEREOF

(71) Applicants: Nexperia Technology (Shanghai) Ltd., Shanghai (CN); NEXPERIA B.V., Nijmegen (NL)

(72) Inventors: Xukun Zhang, Shanghai (CN); Chunlin Zhu, Shanghai (CN); Ke Jiang, Shanghai (CN); Huiling Zuo, Shanghai (CN); Junli Xiang, Shanghai (CN); Jinshan Shi, Shanghai (CN); Yuan Fang, Shanghai (CN)

(73) Assignees: Nexperia Technology (Shanghai) Ltd., Shanghai (CN); Nexperia B.V., NiJmegen (NL)

( * ) Notice: Subject to any disclaimer, the term of this patent is extended or adjusted under 35 U.S.C. 154(b) by 406 days.

(21) Appl. No.: 18/340,583

(22) Filed: Jun. 23, 2023

(65) Prior Publication Data

US 2023/0420558 A1 Dec. 28, 2023

(30) Foreign Application Priority Data

Jun. 24, 2022 (CN) .......................... 202210729165.7

(51) Int. Cl.
| | |
|---|---|
| *H10D 30/66* | (2025.01) |
| *H10D 30/01* | (2025.01) |
| *H10D 62/10* | (2025.01) |
| *H10D 64/27* | (2025.01) |

(52) U.S. Cl.
CPC ....... *H10D 30/668* (2025.01); *H10D 30/0297* (2025.01); *H10D 62/126* (2025.01); *H10D 64/513* (2025.01)

(58) Field of Classification Search
CPC .. H10D 30/668; H10D 62/126; H10D 64/513; H10D 30/0297
See application file for complete search history.

(56) References Cited

U.S. PATENT DOCUMENTS

| | | | | |
|---|---|---|---|---|
| 2013/0248995 | A1* | 9/2013 | Nishiwaki | H10D 30/63 257/334 |
| 2020/0020798 | A1* | 1/2020 | Deng | H10D 30/0297 |
| 2023/0065659 | A1* | 3/2023 | Venkatraman | H10D 30/0291 |
| 2023/0187546 | A1* | 6/2023 | Yedinak | H10D 84/144 |

* cited by examiner

*Primary Examiner* — Michael Jung
(74) *Attorney, Agent, or Firm* — Ruggiero McAllister & McMahon LLC

(57) ABSTRACT

A semiconductor device and a manufacturing method thereof is provided. The device includes a semiconductor layer having a first and second surface opposing each other; a trench gate in the semiconductor layer, extends in a first direction parallel to the first and second surface, and from the first surface to an interior of the layer, and has a gate open end distant from the second surface; a source region of a first conductivity type and a channel region of a second conductivity type, orthographic projections of the source region and the channel region on the second surface at least partially overlap with each other in a depth direction of the trench gate, the source region having a source open end distant from the second surface, and the farther the source open end is from the second surface, the smaller a width of the source open end in the second direction.

23 Claims, 9 Drawing Sheets

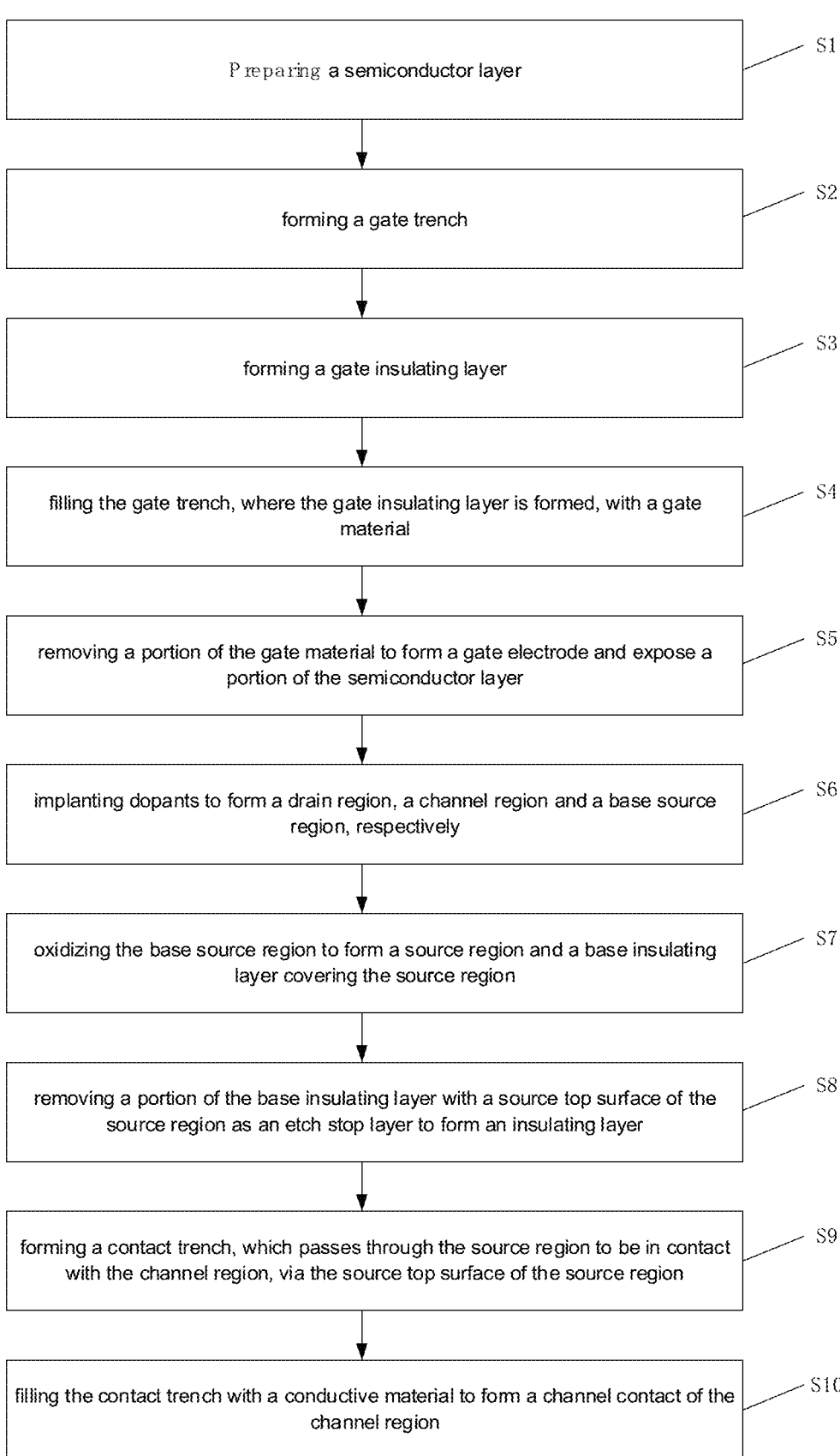

| | |
|---|---|
| Preparing a semiconductor layer | S1 |
| forming a gate trench | S2 |
| forming a gate insulating layer | S3 |
| filling the gate trench, where the gate insulating layer is formed, with a gate material | S4 |
| removing a portion of the gate material to form a gate electrode and expose a portion of the semiconductor layer | S5 |
| implanting dopants to form a drain region, a channel region and a base source region, respectively | S6 |
| oxidizing the base source region to form a source region and a base insulating layer covering the source region | S7 |
| removing a portion of the base insulating layer with a source top surface of the source region as an etch stop layer to form an insulating layer | S8 |
| forming a contact trench, which passes through the source region to be in contact with the channel region, via the source top surface of the source region | S9 |
| filling the contact trench with a conductive material to form a channel contact of the channel region | S10 |

Fig. 5

SEMICONDUCTOR DEVICE INCLUDING TRENCH GATE AND SOURCE OPEN END AND MANUFACTURING METHOD THEREOF

CROSS-REFERENCE TO RELATED APPLICATIONS

This application claims the benefit under 35 U.S.C. § 119(a) of Chinese Application No. 202210729165.7 filed Jun. 24, 2022, the contents of which are incorporated by reference herein in their entirety.

BACKGROUND

1. Field of the Disclosure

The present disclosure belongs to the field of electronic devices, and particularly relates to a semiconductor device and a manufacturing method thereof.

2. Description of the Related Art

Semiconductor devices such as trench gate field effect transistors have received increasing attention due to their excellent performance. As shown in FIGS. 1 and 2, a trench gate type field effect transistor generally includes a source region a channel region 11, a drain region 12, a trench gate 13, and a contact trench 14 connected to the channel region 11. A first width W1 of the channel region 11 (i.e. a mesa between two adjacent trench gates 13) of the semiconductor device determines a current density of the channel region 11 of the semiconductor device. In order to increase the current density, the first width W1 of the channel region 11 needs to be reduced. The reduced first width W1 accordingly would cause a second width W2 of the contact trench 14 above the channel region 11 to become smaller. For the semiconductor device of the prior art shown in FIG. 1, a commonly-used contact lithography technology of 0.18 μm power platform process is used, the first width W1 of the channel region 11 may be approximately less than 1 μm, and the second width W2 may be approximately less than 0.3 μm. In order to further increase the current density, it is required to further reduce the first width W1 of the channel region 11 and the second width W2 of the contact trench 14. With this object, it is difficult to accurately form a narrower contact channel 14 with the commonly-used contact lithography technology of 0.18 μm power platform process.

SUMMARY

The present disclosure discloses a semiconductor device and a manufacturing method thereof.

The semiconductor device includes a semiconductor layer, having a first surface and a second surface opposing each other; a trench gate in the semiconductor layer, wherein the trench gate extends in a first direction parallel to the first surface and the second surface, and extends from the first surface to an interior of the semiconductor layer, and the trench gate has a gate open end distant from the second surface; a source region of a first conductivity type and a channel region of a second conductivity type in the semiconductor layer, wherein orthographic projections of the source region and the channel region on the second surface at least partially overlap with each other in a depth direction of the trench gate, the source region is farther from the second surface relative to the channel region, and the source region has a source open end distant from the second surface, and the farther the source open end is distant from the second surface, the smaller a width of the source open end in the second direction is, and the second direction is parallel to the first surface and the second surface, wherein the first direction is perpendicular to the second direction; an insulating layer on a side of the source open end distant from the second surface; and a contact trench extending from the insulating layer to pass through the source open end to be in contact with the channel region in the depth direction of the trench gate.

In some embodiments, a source top surface of the source open end distant from the second surface is farther from the second surface than a gate top surface of the gate open end distant from the second surface.

In some embodiments, a distance between the source top surface and the gate top surface in the depth direction of the trench gate is in a range of 0.45 μm to 0.9 μm.

In some embodiments, the gate top surface has a recess portion recessed from an edge region to a middle region in the second direction.

In some embodiments, the insulating layer is on a side of the trench gate distant from the second surface; and the insulating layer has a recess portion recessed from an edge region to a middle region in the second direction at a position corresponding to the recess portion of the gate top surface.

In some embodiments, the insulating layer is conformal to the gate top surface of the trench gate.

In some embodiments, the insulating layer is on a side of the trench gate distant from the second surface; and the insulating layer has a flat surface on a side distant from the second surface.

In some embodiments, the insulating layer completely covers a side of both the trench gate and the source region distant from the second surface.

In some embodiments, the insulating layer further extends into the semiconductor layer as a gate insulating layer of the trench gate to isolate the trench gate from the source region and the channel region.

In some embodiments, a material of the semiconductor layer is at least one of Si, SiC or GaN, and a material of the insulating layer is at least one of SiO, SION, SICN, SIOF, or SIOCN.

In some embodiments, a width of the channel region in the second direction is less than 0.6 μm; and a width of the contact trench in the second direction is less than 0.2 μm.

In some embodiments, a cross section of the source open end taken along a plane determined by the second direction and the depth direction of the trench gate has a shape of a trapezoid; the trapezoid has a top side distant from the second surface, a bottom side close to the second surface, a length of the top side is less than a length of the bottom side of the trapezoid, and sloping sides between the top side and the bottom side; and an angle between each of the sloping sides and the bottom side is in a range of 55° to 85°.

The method for manufacturing a semiconductor device in the present disclosure includes the following steps: preparing a semiconductor layer having a first surface and a second surface opposing each other; forming a trench gate in the semiconductor layer from a side of the first surface, such that the trench gate extends in a first direction parallel to the first surface and the second surface, and extends from the first surface to an interior of the semiconductor layer, and the trench gate has a gate open end distant from the second surface; forming a source material region of a first conductivity type and a channel region of a second conductivity type from the side of the first surface, such that orthographic projections of the source material region and the channel region on the second surface in a depth direction of the trench gate at least partially overlap with each other, and the source material region is farther from the second surface relative to the channel region; forming an insulating layer on a side of the source material region distant from the second surface, such that the source material region has a source open end distant from the second surface to form a source region, and the farther the source open end is distant from the second surface, the smaller a width of the source open end in the second direction is, wherein the second direction is parallel to the first surface and the second surface, and the first direction is perpendicular to the second direction; and forming a contact trench from a side of the insulating layer distant from the second surface, such that the contact trench extends from the insulating layer to pass through the source open end to be in contact with the channel region in the depth direction of the trench gate.

In some embodiments, the step of forming the insulating layer on the side of the source material region distant from the second surface includes: performing a thermal oxidation growth process on the source material region to form an insulating material layer; and removing a portion of the insulating material layer distant from the second surface by an etching process or a planarization process with a side of the source open end distant from the second surface as an etch stopping layer, to expose at least a portion of the source open end distant from the second surface to form the insulating layer.

In some embodiments, the step of forming the contact trench from a side of the insulating layer distant from the second surface includes forming the contact trench by removing a portion of a material of the source region by a dry etching process for the material of the source region via exposed portion of the source open end.

In some embodiments, the step of forming the trench gate in the semiconductor layer from the side of the first surface includes: forming a trench in the semiconductor layer; forming a gate oxide layer on a surface of the trench and a side of the semiconductor layer distant from the second surface; filling up the trench with the gate oxide layer formed on its surface with a gate material; performing an etching process on the gate material and the gate oxide layer to expose a portion of the semiconductor layer distant from the second surface and a portion of the gate material in the trench, such that a gate top surface of the gate material in the trench distant from the second surface is farther from the second surface than a source top surface of the exposed semiconductor layer distant from the second surface in the depth direction of the trench to form the trench gate.

In some embodiments, a distance between the source top surface and the gate top surface in the depth direction of the trench gate is in a range of 0.4 μm to 0.8 μm.

In some embodiments, the gate top surface has a recess portion recessed from an edge region to a middle region in the second direction.

In some embodiments, the step of forming the source material region of the first conductivity type and the channel region of the second conductivity type from the side of the first surface includes: implanting dopants of the second conductivity type into the semiconductor layer from the side of the first surface and driving the dopants of the second conductivity type into an interior of the semiconductor layer to form the channel region; and implanting dopants of the first conductivity type into the semiconductor layer from the side of the first surface to form the source material region.

In some embodiments, a material of the semiconductor layer is at least one of Si, SiC or GaN, and a material of the insulating layer is at least one of SiO, SION, SICN, SIOF, or SIOCN, the step of forming the insulating layer on the side of the source material region distant from the second surface includes performing a thermal oxidation growth process on the source material region to form the source region and forming an insulating material layer completely covering the source region and the trench gate; and performing an etching process on the insulating material layer to expose at least a portion of the source region distant from the second surface to form the insulating layer that is conformal to the gate top surface of the trench gate.

In some embodiments, a material of the semiconductor layer is silicon, and a material of the gate oxide layer is silicon oxide, the step of forming the insulating layer on the side of the source material region distant from the second surface includes performing a thermal oxidation growth process on the source material region to form the source region and forming an insulating material layer completely covering the source region and the trench gate; and performing a planarization process on the insulating material layer to expose at least a portion of the source region distant from the second surface.

In some embodiments, the method further includes the step of filling the contact trench with a conductive material to form a channel contact region of the channel region.

Different from the prior art, in the present disclosure, a protruding source base structure is oxidized by a thermal oxidation process to form a structure of a self-alignment source region narrow at the top and wide at the bottom when manufacturing a semiconductor device such as a trench gate type field effect transistor, thereby defining a size of the contact trench, and then a structure of the self-alignment source region surrounded by the insulating layer is etched by an anisotropic etching method to form a contact trench. By means of this method, a narrower contact trench may be formed as required, thereby avoiding process limitation of the commonly-used contact lithography technology of 0.18 μm power platform process, and forming a semiconductor device with higher current density.

BRIEF DESCRIPTION OF DRAWINGS

The accompanying drawings, which are provided for further understanding of embodiments of the present disclosure and constitute a part of this specification, are for explaining the present disclosure together with the embodiments of the present disclosure but are not intended to limit the present disclosure. The above and other features and advantages would become more apparent to a person skilled in the art by describing detailed exemplary embodiments thereof with reference to the drawings. In the drawings:

FIG. 5 shows a flowchart of a method for manufacturing a trench gate field effect transistor according to an embodiment of the present disclosure.

DETAIL DESCRIPTION

In order to enable a person skilled in the art to better understand the technical solutions of the present disclosure, the present disclosure will be described in further detail with reference to the accompanying drawings and the specific embodiments below.

Figure 1:
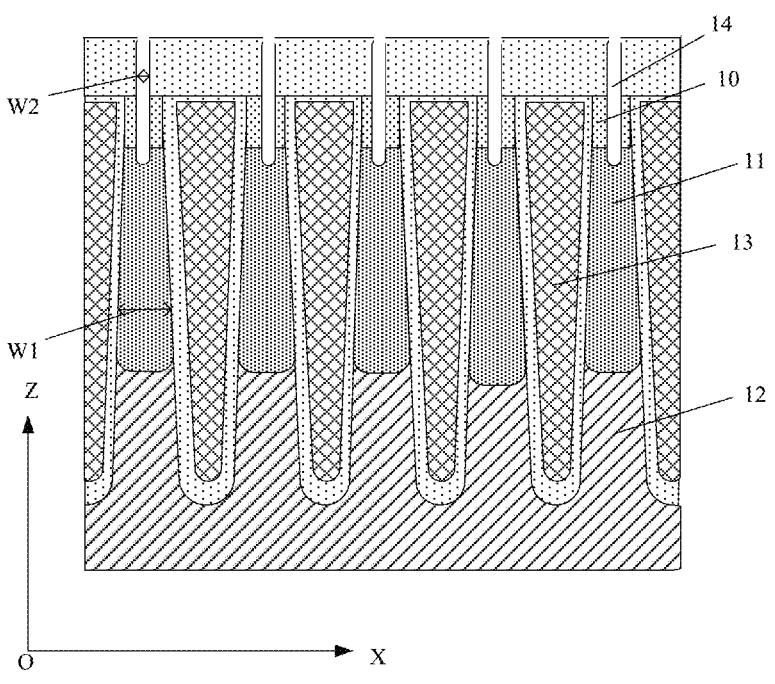
FIG. 1 shows a schematic diagram of a cross-section of a trench gate field effect transistor in the prior art.
Figure 2:
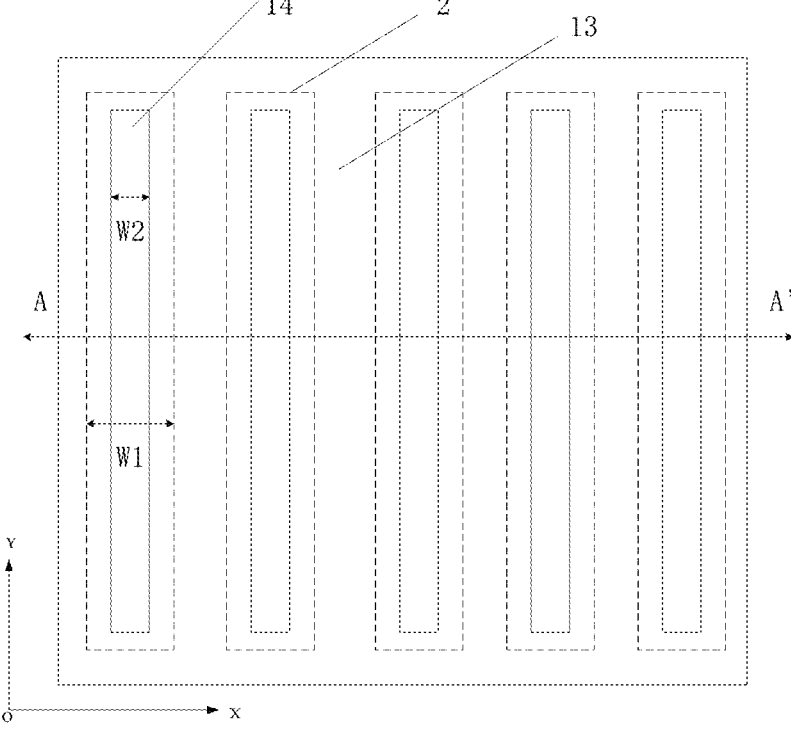
FIG. 2 shows a schematic top view of a trench gate field effect transistor in the prior art.

FIGS. 1 and 2 show a schematic diagram of a cross-section and a top view of a trench gate field effect transistor in the prior art, respectively. FIG. 1 is a schematic diagram of a cross-section of a trench gate field effect transistor taken along line AA' shown in FIG. 2. As shown in FIGS. 1 and 2, a plurality of trench gate field effect transistors are arranged side by side along a second direction X in the semiconductor layer. Specifically, a plurality of stripe-shaped units 2 are arranged in parallel with each other in the semiconductor layer. Two adjacent stripe-shaped units 2 are separated from each other by a strip-shaped trench gate 13. A distance between two adjacent trench gates 3 (i.e. a width W1 of each strip-shaped unit 2 (also referred to as a mesa) along the second direction X) is, for example, approximately 1 μm. An elongated contact trench 14 having a rectangular shape in the plan view shown in FIG. 2 is formed in each strip-shaped unit 2. That is, the contact trench 14 extends along a first direction Y. The contact trench 14 extends from one longitudinal end to the other longitudinal end of a corresponding strip-shaped unit 2. A width W2 of the contact trench 14 along the second direction X is, for example, approximately 0.3 μm.

Based on the prior art, in order to further increase a current density of a semiconductor device such as a trench gate field effect transistor, it is necessary to further reduce the width of a channel region. The reduced width of the channel region necessarily makes it difficult to align and form a smaller contact trench extending through the source region to be in contact with the channel region. In view of this, the present disclosure provides a semiconductor device having a channel region with a smaller size and a contact trench with a smaller width.

The semiconductor device of the present disclosure includes a semiconductor layer having a first surface and a second surface opposing each other; a trench gate in the semiconductor layer, extending in a first direction parallel to the first surface and the second surface, and extending from the first surface to an interior of the semiconductor layer. The trench gate has a gate open end distant from the second surface. A source region of a first conductivity type and a channel region of a second conductivity type are provided, wherein orthographic projections of the source region and the channel region on the second surface in a depth direction of the trench gate at least partially overlap with each other. As such, in the present disclosure, the closer the gate open end of the trench gate to the first surface is, the wider the width of the gate open end of the trench gate is. The closer the source region to the first surface is, the narrower the width of the source region is. The source region is farther from the second surface relative to the channel region, the source region has a source open end distant from the second surface. The farther the source open end is from the second surface, the narrower the width of the source open end in the second direction is, wherein the second direction is parallel to the first surface and the second surface, and the first direction is perpendicular to the second direction. Regarding the insulating layer, the insulating layer is located on a side of the source open end distant from the second surface. Meanwhile, the contact trench extends from the insulating layer and passes through the source open end to be in contact with the channel region in the depth direction of the trench gate.

In the present disclosure, the term "in" or "on" means a position of each element and a positional relationship between two elements when describing the semiconductor device. For example, "a trench gate in a semiconductor layer" means that the trench gate is located in the semiconductor layer. "An insulating layer on a side of the source open end distant from the second surface" means that the insulating layer is farther from the second surface relative to the source open end. In the following description, the term "cover" means that "one element is formed directly on a surface of the other element", and the term "completely cover" means "one element is formed directly on an entire surface of the other element".

Figure 3:
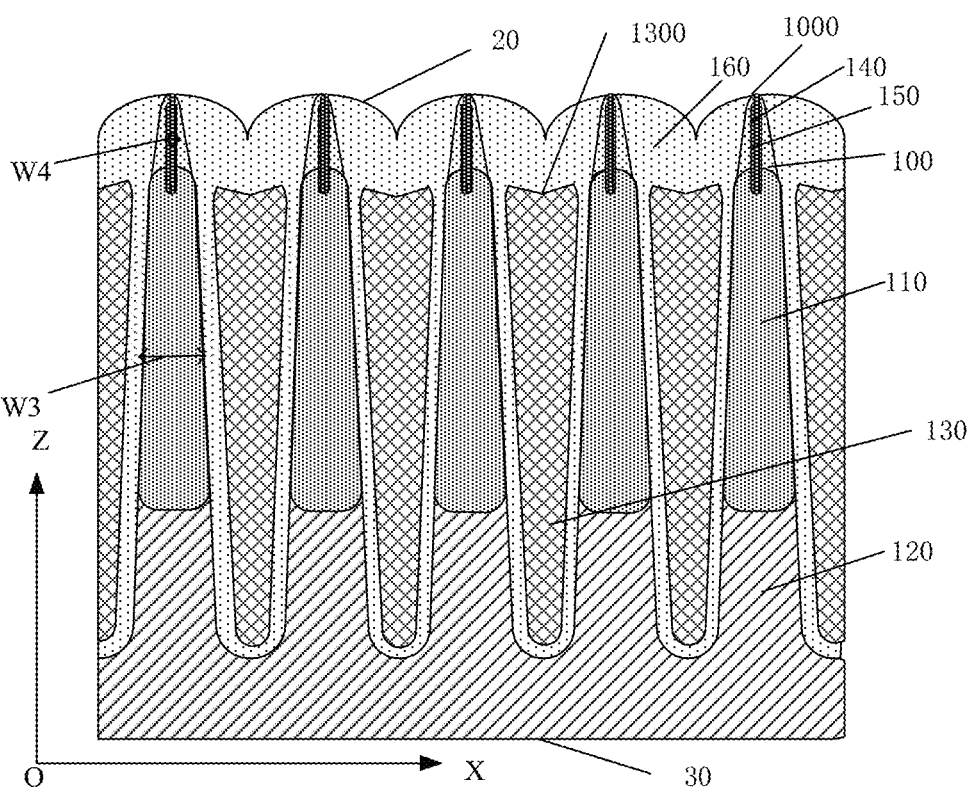
FIG. 3 shows a schematic diagram of a cross-section of a trench gate field effect transistor according to an embodiment of the present disclosure.
Figure 4:
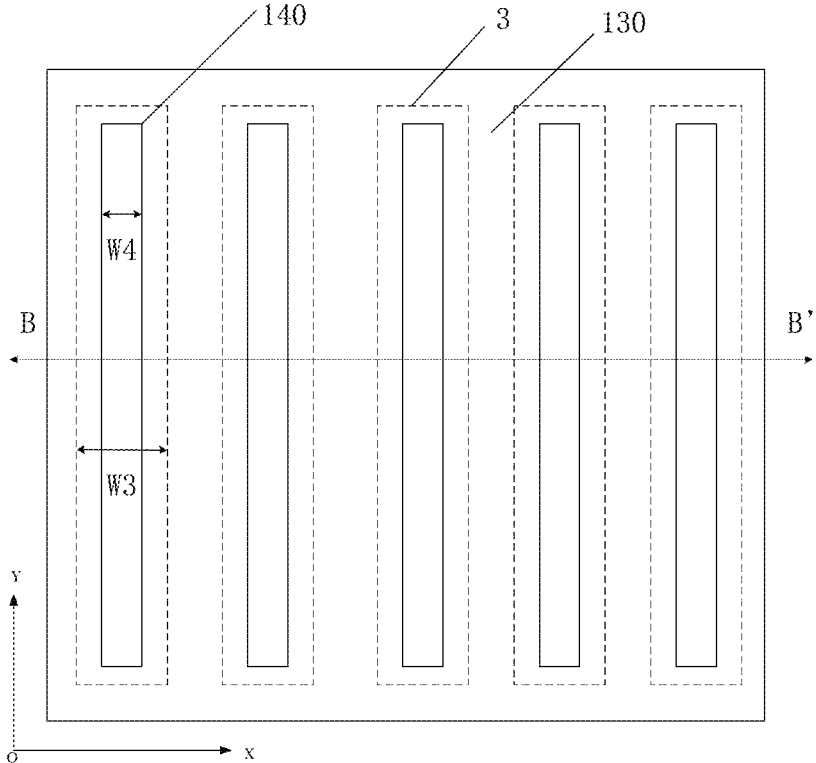
FIG. 4 shows a schematic top view of a trench gate field effect transistor according to an embodiment of the present disclosure.

Further, in one embodiment, FIGS. 3 and 4 show schematic diagrams of a cross-section and a top view of a trench gate field effect transistor of the present disclosure, respectively. FIG. 3 is a schematic diagram of a cross-section of the trench gate field effect transistor taken along the line BB' shown in FIG. 4. As shown in FIGS. 3 and 4, a plurality of trench gate field effect transistors are arranged side by side along the second direction X in the semiconductor layer. Specifically, a plurality of stripe-shaped units 3 are arranged in parallel with each other in the semiconductor layer. Every two adjacent stripe-shaped units 3 are separated from each other by a strip-shaped trench gate 130. A distance between two adjacent trench gates 130 (i.e., a width W3 of each strip-shaped unit 3 (also referred to as a mesa) along the second direction X) may be, for example, approximately less than (for example, approximately 0.4 μm or 0.5 μm). An elongated contact trench 140 having a rectangular shape in the plan view shown in FIG. 3 is formed in each strip-shaped unit 3. That is, the contact trench 140 extends along the first direction Y. The contact trench 140 extends from one longitudinal end to the other longitudinal end of the strip-shaped unit 3. A width W4 of the contact trench 140 along the second direction X may be, for example, approximately less than 0.2 μm (for example, 0.15 μm).

Specifically, in one embodiment, as shown in FIG. 3, the semiconductor device includes a drain region 120, a channel region 110, a source region 100, a trench gate 130 and an insulating layer 160 arranged along a depth direction of the semiconductor layer (a third direction Z as shown in FIG. 3). In this embodiment, the insulating layer 160 extends from a first surface 20 to a bottom of the trench gate 130, and a portion of the insulating layer 160 surrounding the trench gate 130 serves as a gate insulating layer of the trench gate. A material of the insulating layer 160 includes at least one of the following: SiO, SION, SICN, SIOF or SIOCN, for example, silicon oxide. In this embodiment, in the depth direction Z of the trench gate 130, orthographic projections of the drain region 120, the channel region 110 and the source region 100 on the second surface 30 at least partially overlap with each other.

Different from the trench gate field effect transistor in the prior art shown in FIG. 1, as shown in FIG. 3, the width, along the second direction X, of the source region 100 of the trench gate field effect transistor of the present disclosure gradually decreases as the source region is farther from the second surface 30. That is, the cross-section of the source region 100 along a plane defined by the second direction X and the third direction Z is substantially a structure narrow at the top and wide at the bottom. Therefore, the width of a portion of the source region 100 farthest from the second surface 30 (that is, a source top surface 1000) is smaller than a width of a portion of the source region 100 closest to the second surface 30 (that is, a source bottom surface). For example, according to an actual selection for a manufacturing process, the structure narrow at the top and wide at the bottom may be an overall structure gradually narrowing from the bottom to the top, or may be a structure with only a part gradually narrowing in the direction from the bottom to the top. The present disclosure is not limited thereto. For example, the cross-section of the structure narrow at the top and wide at the bottom of the source region taken along the plane defined by the second direction X and the third direction Z may be a trapezoid, and the width of a portion of the trapezoid farthest from the second surface 30 is smaller than the width of a portion of the source region 100 closest to the second surface 30.

In some embodiments, a cross-section of the source open end taken along the plane defined by the second direction and the depth direction of the trench gate is a trapezoid. A side of the trapezoid distant from the second surface is a top side of the trapezoid, a side of the trapezoid close to the second surface is a bottom side of the trapezoid. The length of the top side of the trapezoid is less than the length of the bottom side, and there are sloping sides of the trapezoid between the top side and the bottom side, and an angle between the sloping side and the bottom side is in a range of 55° to 85°.

As shown in FIG. 3, the insulating layer 160 covers a side of the first surface of the semiconductor device, and only a part or all of the source top surface 1000 may be exposed according to process requirements, which depends on a size of the contact trench 140 to be formed. The contact trench 140 extends from the portion, which is exposed by the insulating layer 160, of the source top surface 1000 to pass through the source region 100 and be in contact with the channel region 110. Further, the semiconductor device includes a metal material, which is filled in the contact trench 140, to form a trench contact 150.

In the embodiment shown in FIG. 3, the source region 100 may be of a first conductivity type, and the channel region 110 is of a second conductivity type. The first conductivity type is, for example, N+ type, and the second conductivity type is, for example, P+ type. A specific doping concentration may be set according to actual requirements, for example, it may be $1 \times 10^{17}$ to $5 \times 10^{17}$ cm$^{-3}$.

As shown in FIG. 3, a gate top surface 1300 of the trench gate 130 distant from the second surface 30 is closer to the second surface 30 than the source top surface 1000. For example, a distance between the source top surface 1000 and the gate top surface 1300 in the depth direction of the trench gate 140 is approximately in a range of 0.45 μm to 0.9 μm, for example, in a range of 0.43 μm to 0.888 μm.

The insulating layer 160 covers a side surface of the source region 100 and the gate top surface 1300, and only exposes a portion of the source top surface 1000. In this way, a contact trench 140 with a narrower width may be formed by etching processes specific to different materials. For example, a material of the semiconductor layer may be silicon, a material of the source region 100 may also be silicon, and a material of the insulating layer may be silicon oxide formed by oxidizing silicon. In this case, the width W3 of the channel region 100 in the second direction X may be less than 0.6 μm, and the width of the contact trench 140 in the second direction X may be less than 0.2 μm.

Figure 16:
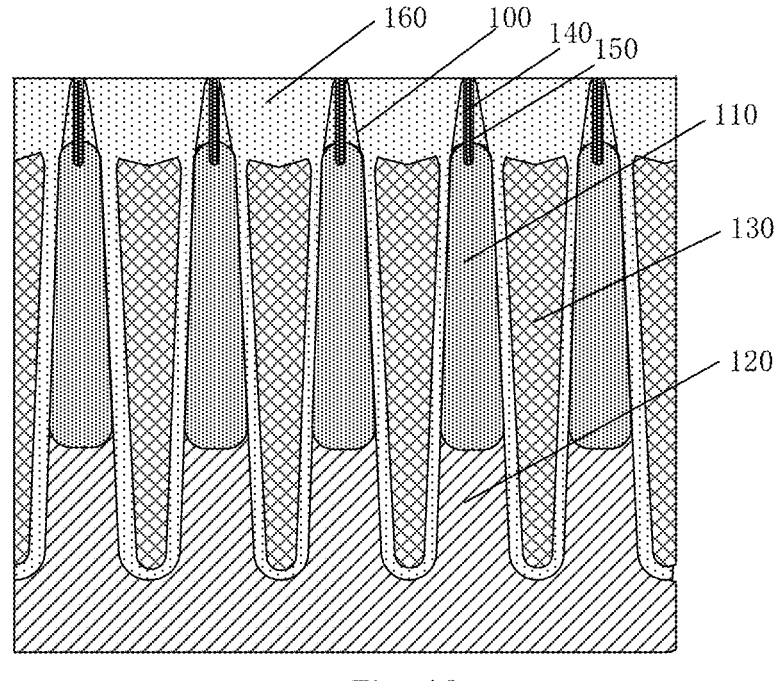
FIG. 16 shows a schematic diagram of a structure obtained after filling the contact trench with a conductive material to form a channel contact in the method for manufacturing a trench gate field effect transistor according to an embodiment of the present disclosure.

As shown in FIG. 3, the gate top surface 1300 has a recess portion recessed from an edge region to a middle region in the second direction X. The insulating layer 160 further covers a side of the trench gate 130 distant from the second surface 30, and the insulating layer 160 generally has a recess portion recessed from an edge region to a middle region in the second direction X at a position corresponding to the recess portion of the gate top surface 1300. For example, the insulating layer 160 is conformal to the gate top surface 1300 of the trench gate 130. That is, when the trench gate 130 is translated along the third direction Z to be in contact with the surface of the insulating layer 160 distant from the second surface 30, the recess portion of the gate top surface 1300 and the recess portion of the insulating layer 160 would substantially overlap with each other. However, the present disclosure is not limited thereto. As shown in FIG. 16, a surface of the insulating layer 160 distant from the second surface 30 is a flat surface. For example, the flat surface of the insulating layer 160 may be formed by a mechanical polishing process.

In the present disclosure, with the source region 100 formed on the mesa between two adjacent trench gates 130 to have a structure gradually narrowing on the side distant from the second surface 30 of the semiconductor layer, a narrower contact trench 140 may be formed. Therefore, the width of the mesa may be reduced, and a narrower channel region 110 may be obtained, which could improve the current density of the semiconductor device.

A method for manufacturing a trench gate field effect transistor shown in FIG. may be used to manufacture the trench gate field effect transistor shown in FIG. 3 and FIG. 4.

Specifically, FIG. 5 shows a flowchart of a method for manufacturing a trench gate field effect transistor according to an embodiment of the present disclosure. The method may include steps S1 to S10.

In step S1, a semiconductor layer is prepared. A material of the semiconductor layer may be an N-type semiconductor material or a P-type semiconductor material. The main doping materials of the N-type and P-type semiconductor materials may be phosphorus and boron, respectively. The doping concentration of the semiconductor layer may be in the range of $10^{13}$ cm$^{-3}$ to $10^{14}$ cm$^{-3}$, and a portion of the semiconductor layer close to the second surface may be directly used as a drain region of the trench gate field effect transistor to be formed, for example the drain region 120 shown in FIG. 3.

In step S2, a gate trench is formed.

In one embodiment, a chemical vapor deposition process (CVD) may be used to deposit an oxide layer on the surface of the semiconductor layer as a mask layer used during an etching process for a trench gate, and its thickness may be in the range of 0.3 μm to 0.8 μm. Alternatively, a photoresist may be used as a mask layer during the etching process for the trench gate.

Figure 6:
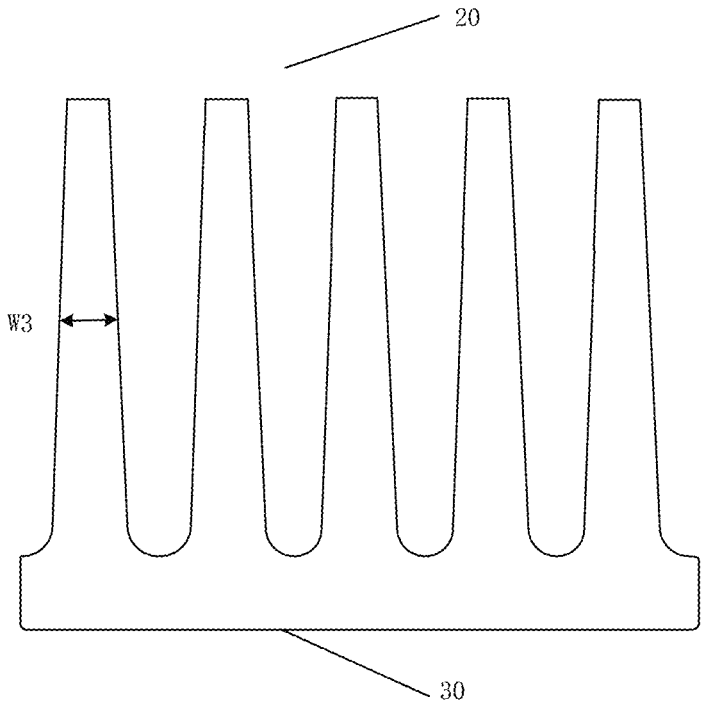
FIG. 6 shows a schematic diagram of a structure obtained after forming a trench in a semiconductor layer in the method for manufacturing a trench gate field effect transistor according to an embodiment of the present disclosure.

The semiconductor layer is etched to form a gate trench with the mask layer. A depth of the gate trench may be in the range of 2 μm to 8 μm (for example, 3 μm to 6 μm), while a sloping angle of a sidewall of the gate trench is, for example, between 87° and 90°, as shown in FIG. 6. This step would define the width W3 of the channel region. As described above, the width of the channel region of the trench gate field effect transistor of the present disclosure may be designed to be less than 0.6 μm to increase the current density in the channel region and improve the performance of the semiconductor device. This also reduces the width of the mesa between two adjacent trench gates, thereby making it difficult to subsequently form a contact trench connected to the channel region. The source region with a specific structure and the insulating layer covering the source region in the present disclosure may form a contact trench for the channel region that is reliably aligned in the case where the width of the channel region is narrow.

As shown in FIG. 6, since the formed gate trench has a very small slope, in the depth direction of the gate trench, the width of the channel region would have a small fluctuation in the direction from the second surface to the first surface of the semiconductor layer, and the channel region with a width of less than 0.6 μm as described above may be considered as an average value or the width the channel region at the middle position in the depth direction of the gate trench.

In step S3, a gate insulating layer is formed.

Figure 7:
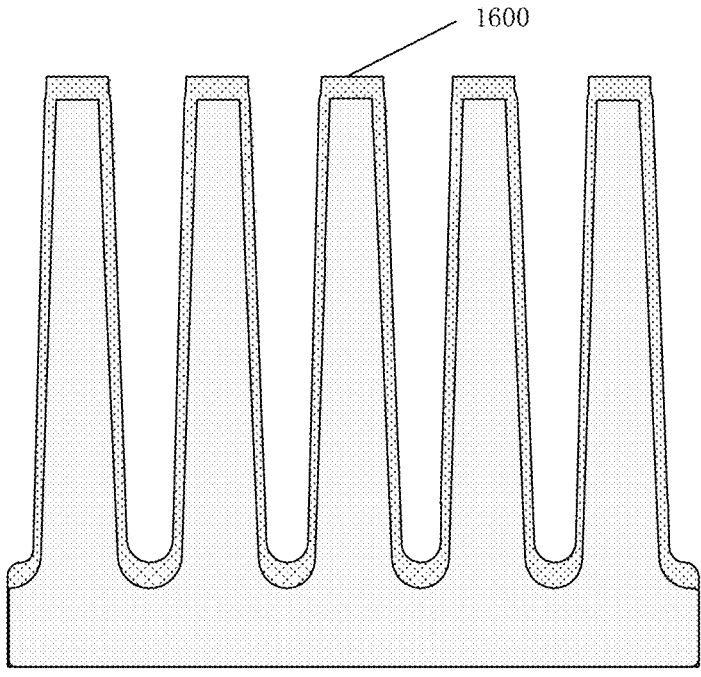
FIG. 7 shows a schematic diagram of a structure obtained after forming a gate oxide layer in a trench in the method for manufacturing a trench gate field effect transistor according to an embodiment of the present disclosure.

In one embodiment, a sacrificial layer with a thickness of 80 nm to 150 nm may be first grown in the gate trench, and a gate oxide layer of 800 nm to 120 nm may then be further grown on the sacrificial layer to serve as the gate insulating layer 1600, as shown in FIG. 7.

In step S4, the gate trench, where the gate insulating layer is formed, is filled with a gate material.

Figure 8:
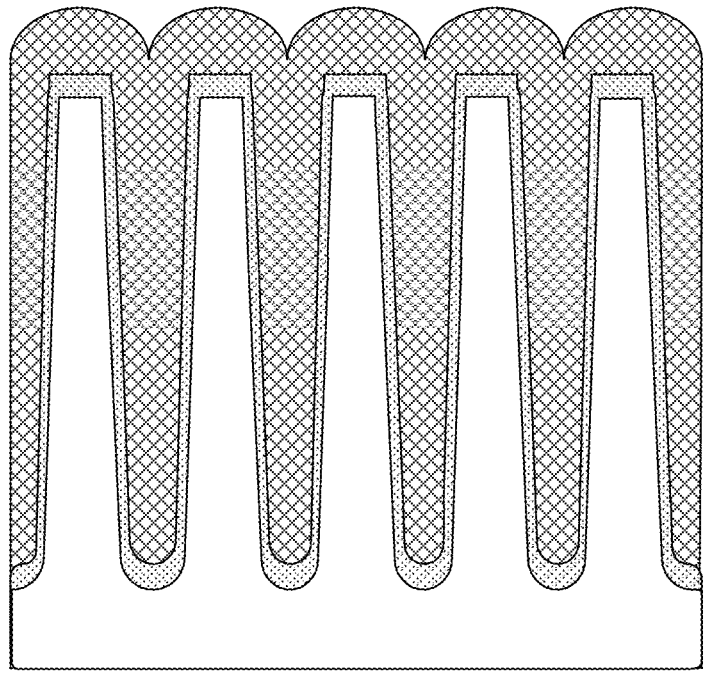
FIG. 8 shows a schematic diagram of a structure obtained after filling, with a gate material, in the trench where the gate oxide layer is formed in the method for manufacturing a trench gate field effect transistor according to an embodiment of the present disclosure.

In one embodiment, the gate material is polysilicon. Tungsten or tungsten silicide may be alternatively used as the gate material. For example, polysilicon may be deposited in the gate trench where the gate insulating layer is formed. For a gate trench of 1 μm or narrower, a thickness of the deposited polysilicon is between 0.6 μm and 1 μm, as shown in FIG. 8.

In step S5, a portion of the gate material is removed to form a gate electrode and exposes a portion of the semiconductor layer.

Figure 9:
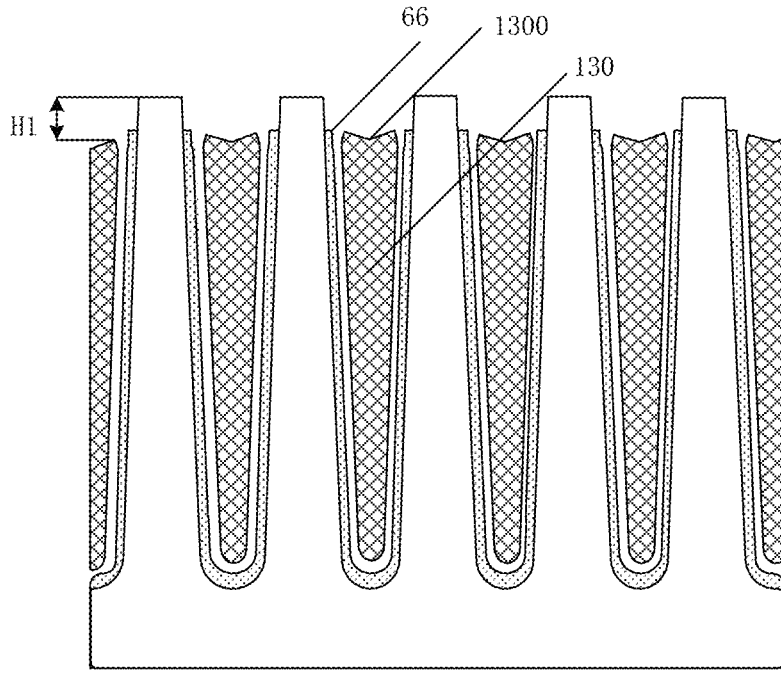
FIG. 9 shows a schematic diagram of a structure obtained after performing an etching process on a gate material and a portion of a gate oxide material in the method for manufacturing a trench gate field effect transistor according to an embodiment of the present disclosure.

In one embodiment, the gate material, for example polysilicon, is removed from a side of the first surface of the semiconductor layer, for example by an etching process. In this step, not only a portion of polysilicon serving as the gate material is removed, but also a portion of the gate insulating layer on the semiconductor layer, where the source region is to be formed, is removed to expose a portion of the semiconductor layer, as shown in FIG. 9. That is, in the step of removing a portion of the gate material and a portion of the gate insulating layer, an over-etching may be performed, such that a depth H1 of a polysilicon recess in the gate trench (a distance from the first surface to the polysilicon of a sidewall of the gate trench) is in a range of 0.4 μm to 0.8 μm.

In the present disclosure, due to the over-etching of polysilicon within the trench gate, the mesa between two adjacent trench gates would become protruding. Then an N-type implantation process is performed to form the source region, such that the top surface and a portion of the sidewall of the source region are exposed together with the gate top surface of the trench gate exposed.

In step S6, dopants are implanted to form a drain region, a channel region and a base source region, respectively.

In one embodiment, P-type dopants may be implanted from a side of the first surface of the semiconductor layer and further driven into an interior of the semiconductor layer to form the channel region. In this step, a P-well implantation process may be first performed during which the thickness of a shielding oxide layer in a range of 30 nm to 50 nm may be used, and a P-well drive-in process may then be performed. Then, a high-energy phosphorus implantation with an implantation energy of about 2 MeV-4 MeV is performed to form the channel region.

After forming the channel region, N-type dopants may be implanted from the side of the first surface of the semiconductor layer and further driven into the interior of the semiconductor layer to form a base source region, such that orthographic projections of the channel region and the base source region on the second surface at least partially overlap with each other.

Further, the N-type dopants may be implanted and driven in from a side of the second surface of the semiconductor layer to form the drain region 120. Alternatively, in one embodiment, a portion of the semiconductor layer with the N-type dopants close to the second surface 30 may be directly used as the drain region 120.

The present disclosure does not specifically limit the above steps of implantation and drive-in processes of dopants to form the channel region 110, the drain region 120 and the source region 100. A person skilled in the art may select doping concentration and drive-in energy according to performance requirements of a desired field effect transistor. Further, the steps of implantation and drive-in processes of dopants of the channel region 110, the drain region 120 and the source region 100 may be alternatively performed before the step S1 of preparing the semiconductor layer. The present disclosure is not limited thereto.

In step S7, the base source region is oxidized to form a source region and a base insulating layer covering the source region.

Figure 10:
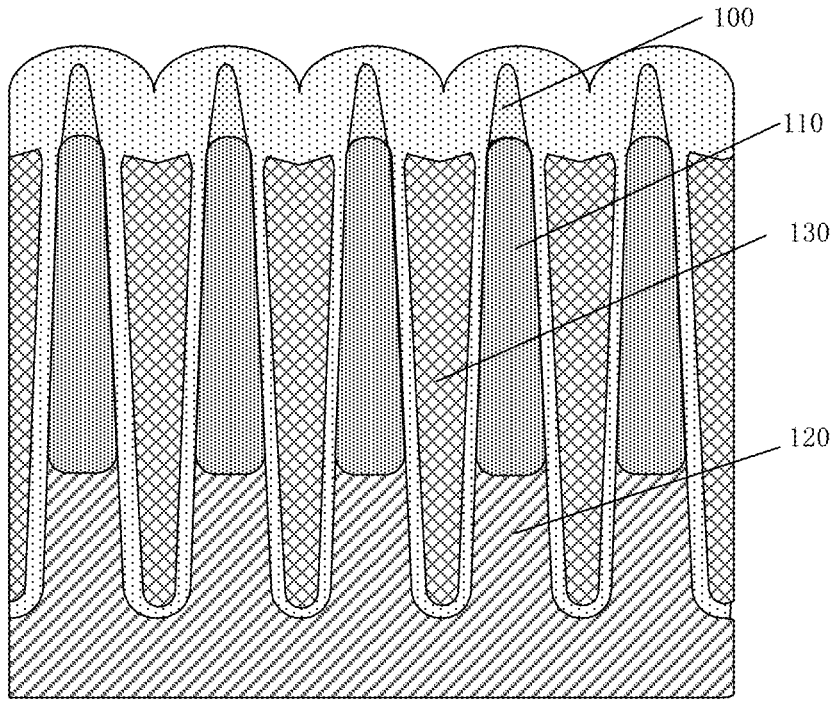
FIG. 10 shows a schematic diagram of a structure obtained after performing ion implantation processes on the channel region and the source region and then performing a thermal oxidation growth process in the method for manufacturing a trench gate field effect transistor according to an embodiment of the present disclosure.

In one embodiment, for a semiconductor device of the present disclosure such as a trench gate type field effect transistor where a distance between two adjacent gate trenches is 0.6 μm or less, a silicon nitride material cannot be formed on a mesa between two adjacent trench gates because the silicon nitride material is easy to fall off. Therefore, in the present disclosure, as shown in FIG. 10, after the polysilicon material as a gate material is partially etched, the exposed portion of the semiconductor layer and the surface of the trench gate are oxidized, the oxidation process may be a low-temperature thermal oxidation process with a thermal oxidation temperature in a range of 800° C. to 900° C. The formed oxide layer covers an entire first surface of the semiconductor layer as an insulating layer, and its thickness may be 100 nm to 200 nm, as shown in FIG. 10. Then, a high-density plasma (HDP) or interlayer dielectric (ILD) deposition process may be employed to increase the thickness of the oxide layer to obtain, for example, an oxide layer of about 1000 nm to 2000 nm, as shown in FIG. 11.

Figure 11:
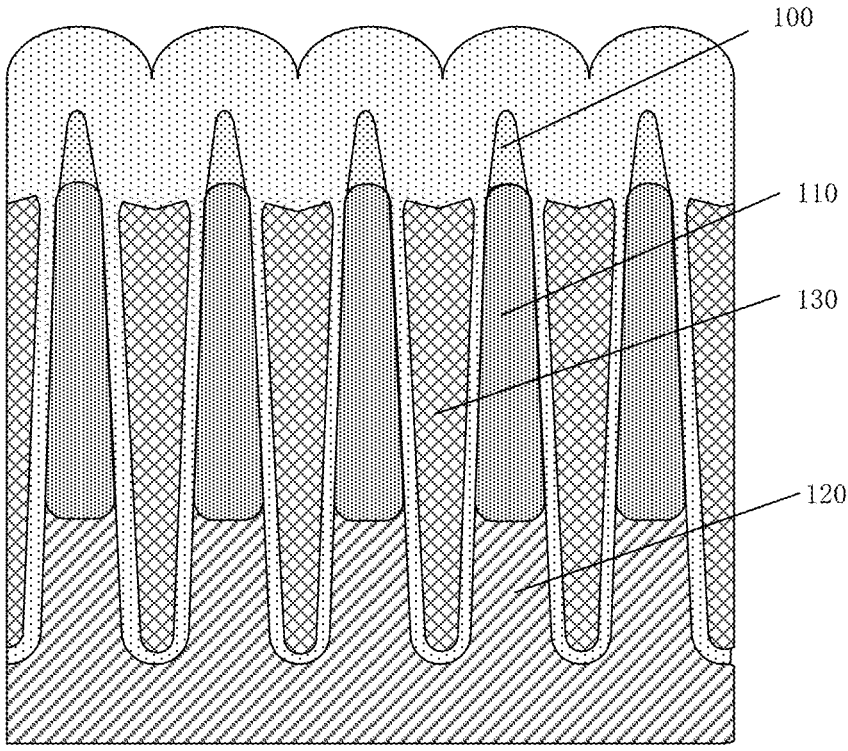
FIG. 11 shows a schematic diagram of a structure obtained after further depositing an oxide layer material in the method for manufacturing a trench gate field effect transistor according to an embodiment of the present disclosure.

As shown in FIGS. 10 and 11, in the step of performing the oxidation process, since the exposed portion of the semiconductor layer, as the portion of the exposed insulating layer forming the source region protrudes relative to the top surface of the trench gate, oxide would be simultaneously grown on the sidewall and the top surface of the exposed portion of the semiconductor layer, and the top surface of the trench gate. This oxidation process will consume a portion of the exposed semiconductor layer, for example, a structure of the source region shown in FIGS. 10 and 11 may be formed by the low-temperature thermal oxidation process at 800° C. to 900° C., that is, formed source region is a structure that gradually narrows. According to the oxidation process being used, the width of a source top surface of the source region in the second direction X may be narrower, for example, the width may be as small as 0.15 μm. The cross-section of the source region 100 formed in this way, when taken along the plane determined by the second direction X and the third direction Z, is similar to a trapezoid.

During this oxidation process, since the oxidation rate of highly doped polysilicon in the trench gate is higher than, for example about 1.7-2 times, the oxidation rate of silicon in the source region, in the above steps, when the depth H1 of a polysilicon recess in the trench gate (a distance from the first surface to a polysilicon sidewall of the trench gate) is in the range of 0.4 μm to 0.8 μm, the distance between the source top surface 1000 and the gate top surface 1300 in the depth direction of the trench gate 140 is approximately in the range of 0.45 μm to 0.9 μm, for example, in the range of 0.43 μm to 0.888 μm. That is, the height difference due to the oxidation process will increase about 0.03 μm-0.088 μm.

During the process of defining the width of the source top surface of the source region, there are several important factors: the distance between two adjacent trench gates (i.e., the width of the mesa), the depth H1 of the polysilicon recess in the trench gate formed in step S5, various parameters of the low temperature thermal oxidation process, and the like. By setting these important factors, the source top surface of the source region of a desired width may be formed, which will determine a width of the subsequently formed contact trench.

In one embodiment, a material such as silicon (Si), silicon carbide (SiC) or gallium nitride (GaN) may be used as the material of the semiconductor layer. The above-mentioned semiconductor material is oxidized by doping nitrogen, carbon, fluorine or the like to form a material of a Low-K insulating layer, for example, silicon oxynitride (SiON), silicon nitride carbide (SiCN), silicon oxyfluoride (SiOF) or silicon oxycarbonitride (SiOCN). Therefore, the exposed material of the semiconductor layer in the step S5 is silicon, the silicon oxide grown by the low temperature thermal oxidation process and the silicon oxide layer surrounding the gate material will form an integrated structure, as shown in FIG. 10.

In step S8, a portion of the base insulating layer is removed by using the source top surface of the source region as an etch stopping layer to form an insulating layer.

Figure 12:
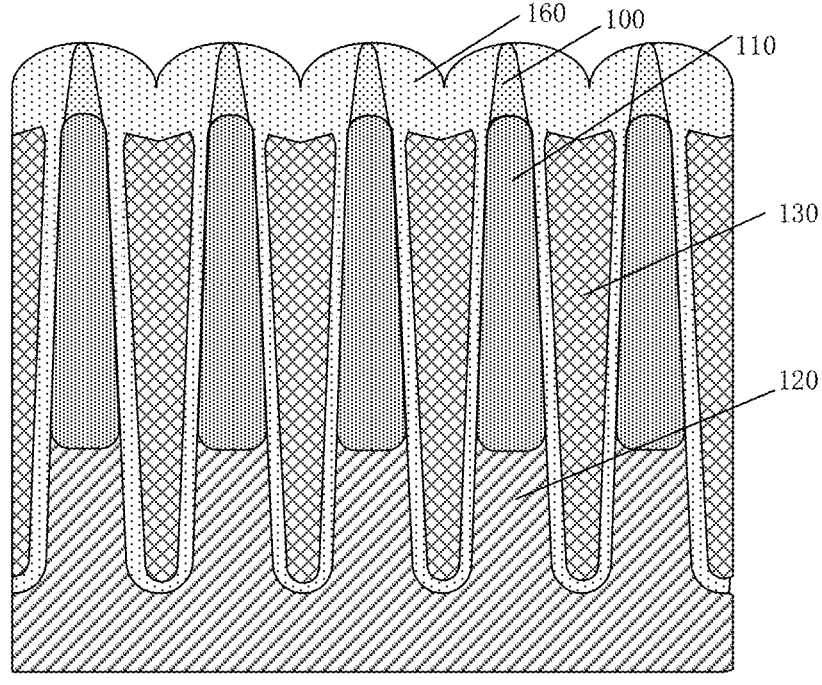
FIG. 12 shows a schematic diagram of a structure obtained after performing an etching process on the oxide layer material to expose a top of the source region in the method for manufacturing a trench gate field effect transistor according to an embodiment of the present disclosure.

In one embodiment, the structure shown in FIG. 12 may be formed by etching the oxide layer by an anisotropic etching process of an interlayer dielectric layer, with the source region of a material (for example, silicon) as an etch stopping layer, to expose at least a portion of the source top surface of the source region distant from the second surface. In this step, the insulating layer 160 and the trench gate 130 formed as shown in FIG. 12 may be conformal. That is, the insulating layer 160 may also have a recess portion recessed from an edge region to a middle region in the second direction X at a position corresponding to the recess portion of the gate top surface of the gate trench 130. As shown in FIG. 12, the oxide layer on the trench gate 130 takes the shape of, for example, an "oxide wing".

Figure 13:
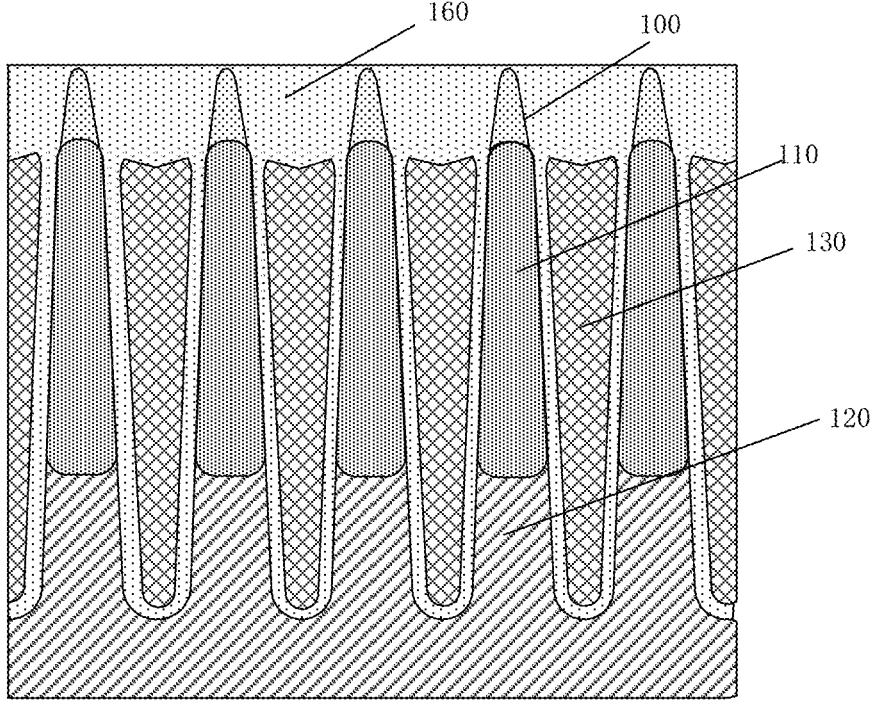
FIG. 13 shows a schematic diagram of a structure obtained after performing a chemical mechanical polishing process on the oxide layer material to expose a top of the source region in the method for manufacturing a trench gate field effect transistor according to an embodiment of the present disclosure.

In another embodiment, a planarization process such as a chemical mechanical polishing (CMP) process may alternatively be used to remove a portion of the base insulating layer, with the source top surface of the source region as an etch stopping layer, to expose at least a portion of the source top surface of the source region distant from the second surface, as shown in FIG. 13.

As described above, the material of the semiconductor layer may be silicon, and the material of the insulating layer may be silicon oxide. In the step S8, the material of the insulating layer is etched back until the source top surface of the source region is exposed. At this time, the area of the exposed portion of the source top surface may be selected as required. For example, if a contact trench with a small width is desired, only a small portion of the source top surface may be exposed, and if a slightly wider contact trench is desired, time and/or intensity of the etching process may be controlled to be higher to expose more of the source top surface. In this way, the width of the contact trench formed by a subsequent self-alignment process may be controlled.

In step S9, a contact trench is formed to pass through the source region to be in contact with the channel region via the source top surface of the source region.

Figure 14:
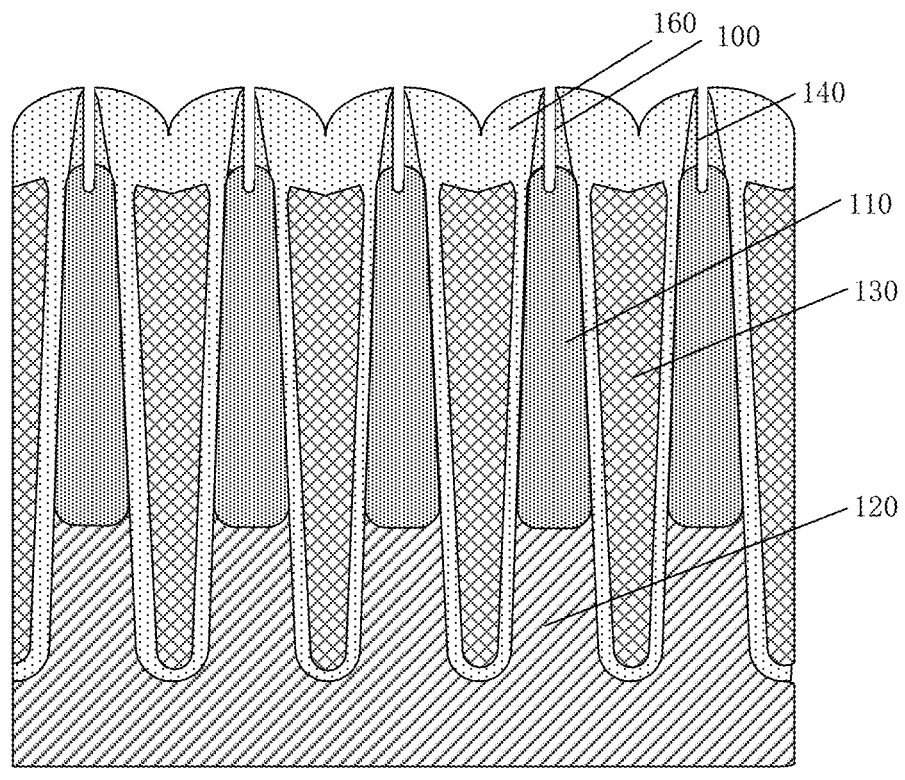
FIGS. 14 and 15 each show a schematic diagram of a structure obtained by performing a chemical etching process the top of the source region to obtain a contact trench in the method for manufacturing a trench gate field effect transistor according to an embodiment of the present disclosure.
Figure 15:
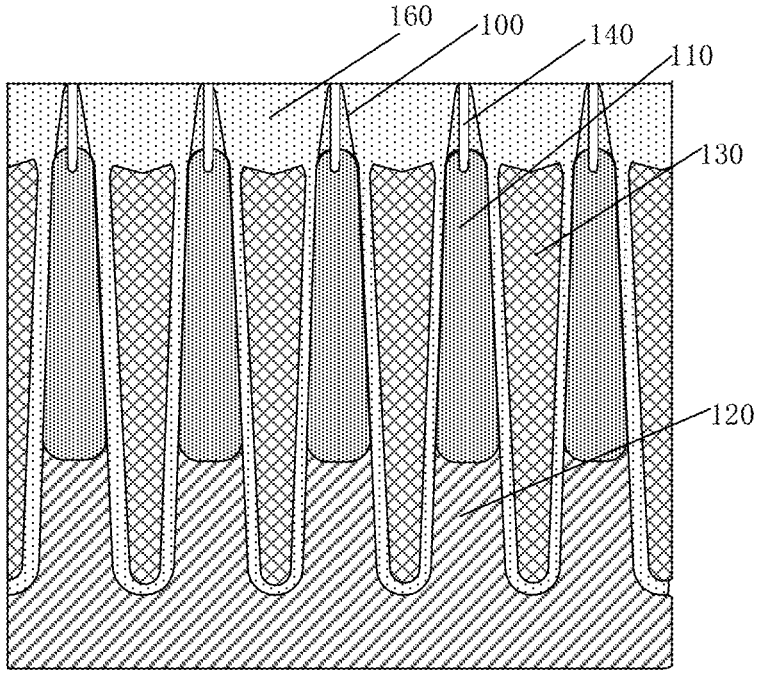

As shown in FIGS. 14 and 15, a dry etching process is used to remove a portion of the material of the source region through the exposed portion of the source top surface to form a contact trench having a depth of about 0.6 μm to 1 μm.

In step S10, the contact trench is filled with a conductive material to form a channel contact of the channel region.

As shown in FIGS. 16 and 3, the contact trench 140 is filled with a conductive material to form the trench contact 150 connected to the channel region 110.

The method for manufacturing the semiconductor device with a smaller channel width and a narrower contact trench of the present disclosure is given above. However, the present disclosure is not limited thereto. For example, between step S9 and step S10, a step may be added to form a channel contact region by further implanting a dopant of a second conductivity type on top of the channel region 110 via the contact trench to reduce a contact resistance between the trench contact 150 to be formed and the channel region 110 in contact with the trench contact 150. The contact trench to be formed in the present disclosure is connected to the channel region, and a portion with a higher doping concentration may alternatively be formed on the channel region as the channel contact region, similar to the source contact region.

As described above, when the gate trench is formed to define the channel region with a smaller size, to accurately align the contact trench formed on the channel region, in the present disclosure, the base source region with a specific structure is formed before forming the source region. That is, the base source region protrudes more than the trench gate in the depth direction of the trench gate, thereby exposing a portion of a sidewall and a top surface of the base source region. This ensures that in a subsequent process of oxidizing and growing the insulating layer, the sidewall and the top surface of the base source region are oxidized simultaneously, and therefore the source region gradually narrowing in the depth direction of the trench gate may be formed to obtain the source top surface with a small size, such that an etching process may be used to form the contact trench in the source region in a self-alignment manner. The channel region of the semiconductor device thus formed has a narrower width and a larger current density, and could have a self-alignment contact trench.

The semiconductor device of the present disclosure, for example a trench gate field effect transistor, may be an insulating gate bipolar transistor. The mesa between two adjacent trench gates of the trench gate field effect transistor of the present disclosure is narrower, for example, the width of the mesa in the second direction X could be less than 0.6 μm, for example 0.4 μm or 0.5 μm, thereby increasing the current density. Further, the source region on the channel region of the semiconductor device and the insulating layer outside thereof have a specific structure: the source region has a gradually narrowing structure in the direction distant from the channel region such that the width of the portion of the source top surface of the source region exposed by the insulating layer in the second direction X may be less than 0.2 μm, for example, 0.15 μm. Based on this, the contact trench of the channel region may be accurately formed in a self-alignment manner. Therefore, a semiconductor device with a higher current density may be obtained.

For the above mentioned semiconductor device, in the method for manufacturing such as a trench gate field effect transistor, when the mesa between two adjacent trench gates is narrower, a portion of the insulating layer at the top of the source base structure is removed while the polysilicon gate is etched back to expose a portion of the semiconductor material, for example silicon, of the semiconductor layer, then the protruding source base structure is oxidized by a thermal oxidation process to form a gradually narrowing structure of a self-alignment source region, then the source top surface of the source region such as silicon is used as an etch stopping layer to remove a portion of the insulating layer on the source region to define the size of the contact trench, and then the self-alignment structure of the source region surrounded by the insulating layer is etched by using, for example, a silicon dry etching process for the source region of a silicon material. With this method, a narrower contact trench may be formed as required, thereby avoiding process limitation of contact lithography technology in a commonly used power platform process, and forming a semiconductor device with a higher current density.

It should be understood that, the above embodiments are merely exemplary embodiments adopted to explain the principles of the present disclosure, and the present disclosure is not limited thereto. It would be apparent to a person skilled in the art that various changes and modifications may be made therein without departing from the spirit and scope of the present disclosure, and such changes and modifications also fall within the scope of the present disclosure.

What is claimed is:

1. A semiconductor device, comprising:
a semiconductor layer having a first surface and a second surface opposing each other;
a trench gate in the semiconductor layer, wherein the trench gate extends in a first direction parallel to the first surface and the second surface, and extends from the first surface to an interior of the semiconductor layer, and wherein the trench gate has a gate open end distant from the second surface;
a source region of a first conductivity type and a channel region of a second conductivity type in the semiconductor layer, wherein orthographic projections of the source region and the channel region on the second surface at least partially overlap with each other in a depth direction of the trench gate, the source region is farther from the second surface relative to the channel region, and the source region has a source open end distant from the second surface, and the farther the source open end is from the second surface, the smaller a width of the source open end in a second direction is, wherein the second direction is parallel to the first surface and the second surface, and the first direction is perpendicular to the second direction;
an insulating layer on a side of the source open end distant from the second surface; and
a contact trench extending from the insulating layer to pass through the source open end to be in contact with the channel region in the depth direction of the trench gate.

2. The semiconductor device according to claim 1, wherein the source open end distant from the second surface has a source top surface that is farther from the second surface than a gate top surface of the gate open end distant from the second surface.

3. The semiconductor device according to claim 2, wherein the source top surface and the gate top surface has a distance in the depth direction of the trench gate that is in a range of 0.45 μm to 0.9 μm.

4. The semiconductor device according to claim 2, wherein the gate top surface has a recess portion recessed from an edge region to a middle region in the second direction.

5. The semiconductor device according to claim 4, wherein the insulating layer is on a side of the trench gate distant from the second surface, and the insulating layer has a recess portion recessed from an edge region to a middle region in the second direction at a position corresponding to the recess portion of the gate top surface.

6. The semiconductor device according to claim 5, wherein the insulating layer is conformal to the gate top surface of the trench gate.

7. The semiconductor device according to claim 4, wherein the insulating layer is on a side of the trench gate distant from the second surface, and the insulating layer has a flat surface on a side distant from the second surface.

8. The semiconductor device according to claim 5, wherein the insulating layer completely covers a side of both the trench gate and the source region distant from the second surface.

9. The semiconductor device according to claim 1, wherein the insulating layer further extends into the semiconductor layer as a gate insulating layer of the trench gate to isolate the trench gate from the source region and the channel region.

10. The semiconductor device according to claim 1, wherein:

the semiconductor layer material is selected from the group consisting of Si, SiC, GaN, and any combination thereof; and the insulating layer material is selected from the group consisting of SiO, SION, SICN, SIOF, SIOCN, and any combination thereof.

11. The semiconductor device according to claim 1, wherein:

the channel region has a width in the second direction that is less than 0.6 μm; and the contact trench has a width in the second direction is less than 0.2 μm.

12. The semiconductor device according to claim 1, wherein the source open end has a cross section taken along a plane determined by the second direction and the depth direction of the trench gate has a shape of a trapezoid;

wherein the trapezoid has a top side distant from the second surface, a bottom side close to the second surface, a length of the top side is less than a length of the bottom side of the trapezoid, and sloping sides between the top side and the bottom side; and an angle between each of the sloping sides and the bottom side is in a range of 55° to 85°.

13. A method for manufacturing a semiconductor device, comprising the steps of:

preparing a semiconductor layer having a first surface and a second surface opposing each other;

forming a trench gate in the semiconductor layer from a side of the first surface, so that the trench gate extends in a first direction parallel to the first surface and the second surface, and extends from the first surface to an interior of the semiconductor layer, and the trench gate has a gate open end distant from the second surface;

forming a source material region of a first conductivity type and a channel region of a second conductivity type from the side of the first surface, so that orthographic projections of the source material region and the channel region on the second surface in a depth direction of the trench gate at least partially overlap with each other, and the source material region is farther from the second surface relative to the channel region;

forming an insulating layer on a side of the source material region distant from the second surface, so that the source material region has a source open end distant from the second surface to form a source region, and the farther the source open end is from the second surface the smaller a width of the source open end in a second direction is, wherein the second direction is parallel to the first surface and the second surface, and the first direction is perpendicular to the second direction; and forming a contact trench from a side of the insulating layer distant from the second surface, so that the contact trench extends from the insulating layer to pass through the source open end to be in contact with the channel region in the depth direction of the trench gate.

14. The method according to claim 13, wherein the step of forming the insulating layer on the side of the source material region distant from the second surface comprises:

performing a thermal oxidation growth process on the source material region to form an insulating material layer; and removing a portion of the insulating material layer distant from the second surface by an etching process or a planarization process with a side of the source open end distant from the second surface as an etch stopping layer, to expose at least a portion of the source open end distant from the second surface to form the insulating layer.

15. The method according to claim 13, wherein the step of forming the contact trench from the side of the insulating layer distant from the second surface comprises forming the contact trench by removing a portion of a material of the source region by a dry etching process for the material of the source region via exposed portion of the source open end.

16. The method according to claim 13, wherein the step of forming the trench gate in the semiconductor layer from the side of the first surface comprises:

forming a trench in the semiconductor layer;

forming a gate oxide layer on a surface of the trench and a side of the semiconductor layer distant from the second surface;

filling up the trench with the gate oxide layer formed on its surface with a gate material;

performing an etching process on the gate material and the gate oxide layer to expose a portion of the semiconductor layer distant from the second surface and a portion of the gate material in the trench, so that a gate top surface of the gate material in the trench distant from the second surface is farther from the second surface than a source top surface of the exposed semiconductor layer distant from the second surface in the depth direction of the trench to form the trench gate.

17. The method according to claim 16, wherein the source top surface and the gate top surface has a distance in the depth direction of the trench gate that is in a range of 0.4 μm to 0.8 μm.

18. The method according to claim 16, wherein the gate top surface has a recess portion recessed from an edge region to a middle region in the second direction.

19. The method according to claim 16, wherein the step of forming the source material region of the first conductivity type and the channel region of the second conductivity type from the side of the first surface comprises:

implanting dopants of the second conductivity type into the semiconductor layer from the side of the first surface and driving the dopants of the second conductivity type into an interior of the semiconductor layer to form the channel region; and implanting dopants of the first conductivity type into the semiconductor layer from the side of the first surface to form the source material region.

20. The method according to claim 16, wherein the semiconductor layer material is selected from the group consisting of, SiC, GaN, and any combination thereof, and the insulating layer material is selected from the group consisting of SiO, SION, SICN, SIOF, SIOCN, and any combination thereof;

wherein the step of forming the insulating layer on the side of the source material region distant from the second surface comprises performing a thermal oxidation growth process on the source material region to form the source region, and forming an insulating material layer completely covering the source region and the trench gate; and performing an etching process on the insulating material layer to expose at least a portion of the source region distant from the second surface to form the insulating layer that is conformal to the gate top surface of the trench gate.

21. The method according to claim 16, wherein the semiconductor layer is comprised of a material that is silicon, the gate oxide layer is comprised of a material that is silicon oxide, wherein the step of forming the insulating layer on the side of the source material region distant from the second surface comprises performing a thermal oxidation growth process on the source material region to form the source region, and forming an insulating material layer completely covering the source region and the trench gate; and performing a planarization process on the insulating material layer to expose at least a portion of the source region distant from the second surface.

22. The method according to claim 13, further comprising the step of:

filling the contact trench with a conductive material to form a channel contact region of the channel region.

23. The method according to claim 22, wherein:

the channel region has a width in the second direction that is less than 0.6 μm; and the trench contact region has a width in the second direction that is less than 0.2 μm.

\* \* \* \* \*